US012628633B2

(12) United States Patent
Lee et al.

(10) Patent No.: US 12,628,633 B2
(45) Date of Patent: May 12, 2026

(54) SEMICONDUCTOR DEVICE INCLUDING SPACER VIA STRUCTURE AND METHOD OF MANUFACTURING THE SAME

(71) Applicant: SAMSUNG ELECTRONICS CO., LTD., Suwon-si (KR)

(72) Inventors: Janggeun Lee, Delmar, NY (US); Jaemyung Choi, Niskayuna, NY (US); Kang-ill Seo, Albany, NY (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 639 days.

(21) Appl. No.: 17/841,245

(22) Filed: Jun. 15, 2022

(65) Prior Publication Data

US 2023/0343697 A1     Oct. 26, 2023

Related U.S. Application Data

(60) Provisional application No. 63/332,916, filed on Apr. 20, 2022.

(51) Int. Cl.
H01L 21/768          (2006.01)
H01L 23/522          (2006.01)

(52) U.S. Cl.
CPC .... H01L 23/5226 (2013.01); H01L 21/76802 (2013.01); H01L 21/76829 (2013.01);
(Continued)

(58) Field of Classification Search
CPC ......... H01L 21/76849; H01L 21/76883; H01L 21/76877; H01L 21/76843;
(Continued)

(56) References Cited

U.S. PATENT DOCUMENTS 4,075,756 A * 2/1978 Kircher ............. H01L 21/02244
427/63
4,489,481 A * 12/1984 Jones .................. H01L 21/3105
257/E21.241
(Continued)

FOREIGN PATENT DOCUMENTS

EP          3669398 A1     6/2020

*Primary Examiner* — David A Zarneke
(74) *Attorney, Agent, or Firm* — Myers Bigel, P.A.

(57) ABSTRACT

A connection structure for an integrated circuit includes: a $1^{st}$ layer including a $1^{st}$ metal line; a $2^{nd}$ layer, above the $1^{st}$ layer, including a $1^{st}$ via; and a $3^{rd}$ layer, above the $2^{nd}$ layer, including a $2^{nd}$ metal line connected to the $1^{st}$ metal line through the $1^{st}$ via, wherein the $1^{st}$ via comprises a spacer structure at a side of an upper portion of the $1^{st}$ via, the spacer structure comprising an insulation material.

8 Claims, 15 Drawing Sheets

300

(52) U.S. Cl.
CPC .. *H01L 21/76831* (2013.01); *H01L 21/76834* (2013.01); *H01L 21/76837* (2013.01); *H01L 21/76843* (2013.01); *H01L 21/76847* (2013.01); *H01L 21/76877* (2013.01)

(58) Field of Classification Search
CPC ........... H01L 21/76847; H01L 21/5283; H01L 21/76829; H01L 21/76834; H01L 21/76837
See application file for complete search history.

(56) References Cited

U.S. PATENT DOCUMENTS

| | | | | |
|---|---|---|---|---|
| 4,621,420 A | * | 11/1986 | Takahashi | C25D 13/22 29/856 |
| 4,641,420 A | * | 2/1987 | Lee | H01L 21/76831 257/E21.585 |
| 4,801,350 A | * | 1/1989 | Mattox | H01L 21/0337 257/E21.038 |
| 4,987,099 A | * | 1/1991 | Flanner | H01L 21/76879 257/E21.586 |
| 5,049,525 A | * | 9/1991 | Coleman, Jr. | H01L 21/76877 257/E21.585 |
| 5,104,826 A | * | 4/1992 | Fujita | H01L 21/76844 438/653 |
| 5,308,793 A | * | 5/1994 | Taguchi | H01L 21/76877 257/E21.585 |
| 5,444,021 A | * | 8/1995 | Chung | H01L 21/76816 257/E23.145 |
| 5,470,789 A | * | 11/1995 | Misawa | H01L 21/76877 257/E21.585 |
| 5,470,792 A | * | 11/1995 | Yamada | H01L 21/76879 257/E21.586 |
| 5,472,912 A | * | 12/1995 | Miller | H01L 21/76877 438/626 |
| 5,478,772 A | * | 12/1995 | Fazan | H01L 21/76889 257/E21.664 |
| 5,527,736 A | * | 6/1996 | Huang | H01L 21/76877 257/E21.585 |
| 5,529,956 A | * | 6/1996 | Morishita | H01L 23/5226 257/E21.585 |
| 5,614,765 A | * | 3/1997 | Avanzino | H01L 23/5226 257/E21.507 |
| 5,686,354 A | * | 11/1997 | Avanzino | H01L 21/76807 438/642 |
| 5,985,751 A | * | 11/1999 | Koyama | H01L 21/76877 257/E21.585 |
| 6,066,536 A | * | 5/2000 | Lin | H01L 28/40 438/379 |
| 6,184,584 B1 | * | 2/2001 | Sakao | H01L 21/76831 257/E21.585 |
| 6,194,309 B1 | * | 2/2001 | Jin | H01L 23/5226 438/533 |
| 6,420,725 B1 | * | 7/2002 | Harshfield | H10N 70/011 257/E21.585 |
| 7,223,693 B2 | | 5/2007 | Choi et al. | |
| 9,935,037 B2 | | 4/2018 | Kang et al. | |
| 10,199,326 B1 | | 2/2019 | Ohsaki | |
| 10,516,030 B2 | | 12/2019 | Pan et al. | |
| 11,069,703 B2 | | 7/2021 | Nishida et al. | |
| 11,495,538 B2 | * | 11/2022 | Xie | H01L 21/76834 |
| 2003/0022486 A1 | * | 1/2003 | Wu | H01L 21/76877 257/E21.585 |
| 2021/0184018 A1 | | 6/2021 | Khaderbad et al. | |
| 2022/0020688 A1 | | 1/2022 | Xie et al. | |

* cited by examiner

FIG. 7

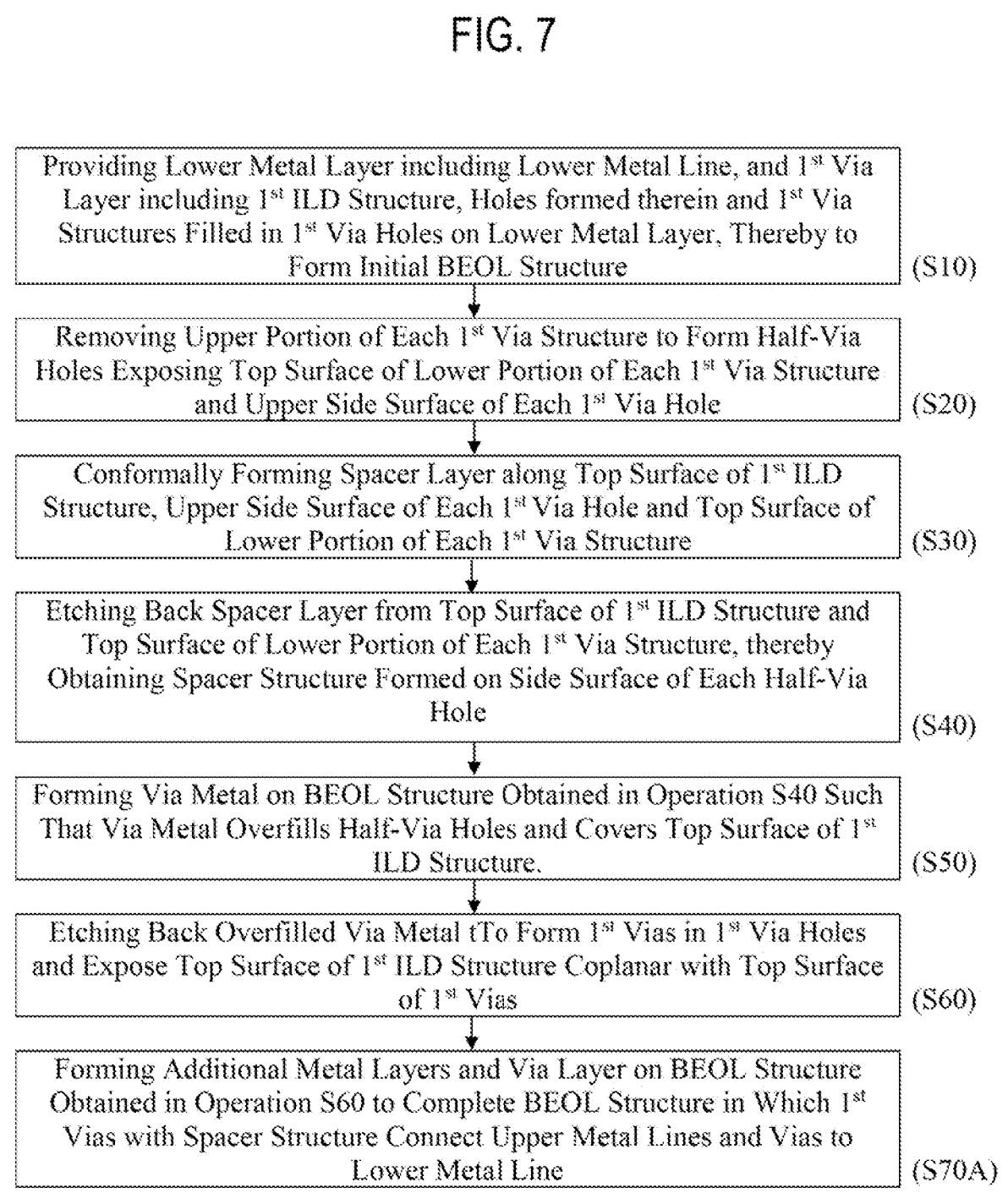

Providing Lower Metal Layer including Lower Metal Line, and 1ˢᵗ Via Layer including 1ˢᵗ ILD Structure, Holes formed therein and 1ˢᵗ Via Structures Filled in 1ˢᵗ Via Holes on Lower Metal Layer, Thereby to Form Initial BEOL Structure  (S10)

Removing Upper Portion of Each 1ˢᵗ Via Structure to Form Half-Via Holes Exposing Top Surface of Lower Portion of Each 1ˢᵗ Via Structure and Upper Side Surface of Each 1ˢᵗ Via Hole  (S20)

Conformally Forming Spacer Layer along Top Surface of 1ˢᵗ ILD Structure, Upper Side Surface of Each 1ˢᵗ Via Hole and Top Surface of Lower Portion of Each 1ˢᵗ Via Structure  (S30)

Etching Back Spacer Layer from Top Surface of 1ˢᵗ ILD Structure and Top Surface of Lower Portion of Each 1ˢᵗ Via Structure, thereby Obtaining Spacer Structure Formed on Side Surface of Each Half-Via Hole  (S40)

Forming Via Metal on BEOL Structure Obtained in Operation S40 Such That Via Metal Overfills Half-Via Holes and Covers Top Surface of 1ˢᵗ ILD Structure.  (S50)

Etching Back Overfilled Via Metal tTo Form 1ˢᵗ Vias in 1ˢᵗ Via Holes and Expose Top Surface of 1ˢᵗ ILD Structure Coplanar with Top Surface of 1ˢᵗ Vias  (S60)

Forming Additional Metal Layers and Via Layer on BEOL Structure Obtained in Operation S60 to Complete BEOL Structure in Which 1ˢᵗ Vias with Spacer Structure Connect Upper Metal Lines and Vias to Lower Metal Line  (S70A)

FIG. 8

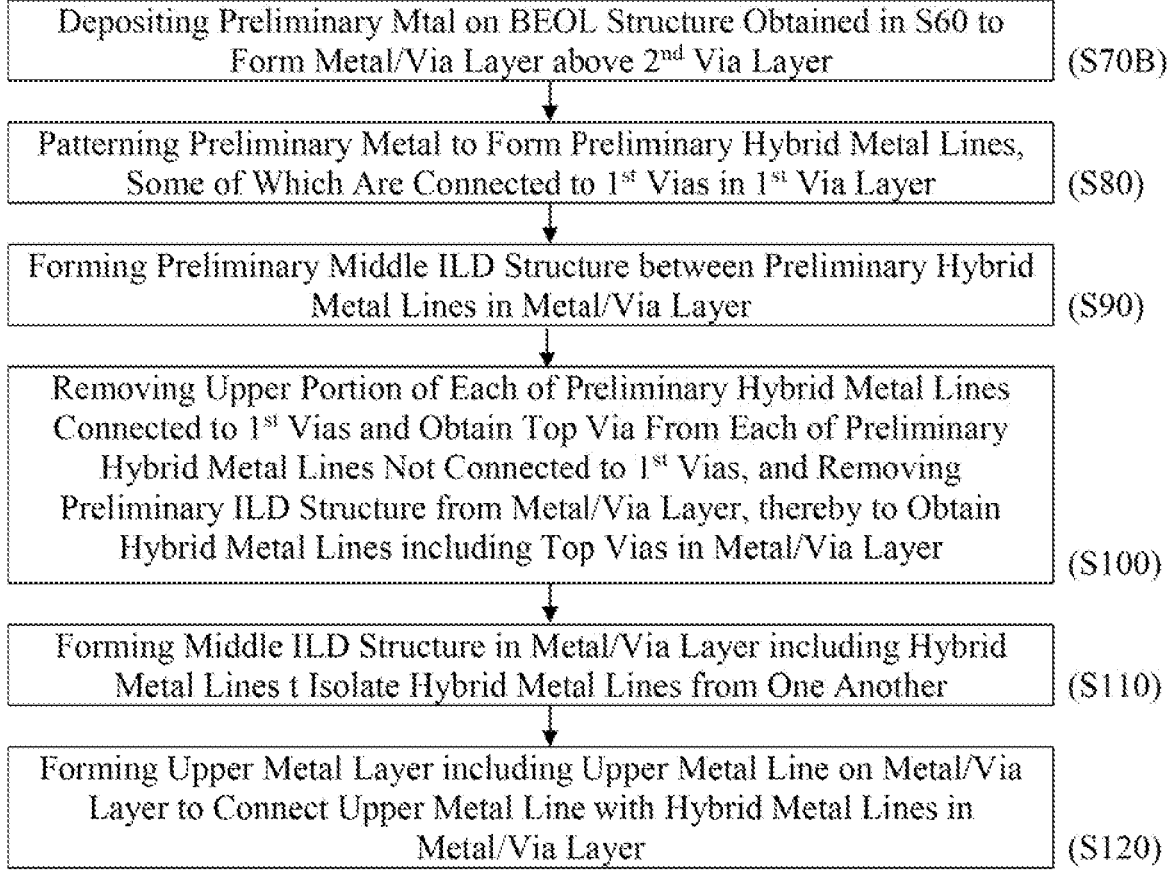

Depositing Preliminary Mtal on BEOL Structure Obtained in S60 to Form Metal/Via Layer above 2$^{nd}$ Via Layer     (S70B)

Patterning Preliminary Metal to Form Preliminary Hybrid Metal Lines, Some of Which Are Connected to 1$^{st}$ Vias in 1$^{st}$ Via Layer     (S80)

Forming Preliminary Middle ILD Structure between Preliminary Hybrid Metal Lines in Metal/Via Layer     (S90)

Removing Upper Portion of Each of Preliminary Hybrid Metal Lines Connected to 1$^{st}$ Vias and Obtain Top Via From Each of Preliminary Hybrid Metal Lines Not Connected to 1$^{st}$ Vias, and Removing Preliminary ILD Structure from Metal/Via Layer, thereby to Obtain Hybrid Metal Lines including Top Vias in Metal/Via Layer     (S100)

Forming Middle ILD Structure in Metal/Via Layer including Hybrid Metal Lines t Isolate Hybrid Metal Lines from One Another     (S110)

Forming Upper Metal Layer including Upper Metal Line on Metal/Via Layer to Connect Upper Metal Line with Hybrid Metal Lines in Metal/Via Layer     (S120)

SEMICONDUCTOR DEVICE INCLUDING SPACER VIA STRUCTURE AND METHOD OF MANUFACTURING THE SAME

CROSS-REFERENCE TO RELATED APPLICATION

This application is based on and claims priority from U.S. Provisional Application No. 63/332,916 filed on Apr. 20, 2022 in the U.S. Patent and Trademark Office, the disclosure of which is incorporated herein in its entirety by reference.

BACKGROUND

1. Field

Apparatuses and methods consistent with example embodiments of the disclosure relate to a connection structure for an integrated circuit, and more particularly to a connection structure including a via structure to which a spacer is attached in a semiconductor device.

2. Description of the Related Art

FIG. 1 illustrates a cross-sectional view of a back-end-of-line (BEOL) structure including a plurality of metal lines and vias formed in a plurality of layers.

A BEOL structure 100 shown in FIG. 1 may be a part of or connected to an integrated circuit (not shown) such as a logic circuit, a memory flip-flop or a latch circuit formed of at least one semiconductor device to receive and output signals for the integrated circuit.

Hereinafter, the "via" refers to a via structure or a via plug which is formed or filled in a via hole to connect two or more metal lines formed at vertically different stacks or layers. Also, the "metal line" refers to a metal pattern or a metal structure which may be connected to a circuit element such as a middle-of-line (MOL) element or a front-end-of-line (FEOL) element in a semiconductor device. For example, the metal line may be a power line connected to a voltage source (Vdd or Vss) to receive a positive voltage or a negative voltage supplied to a semiconductor device connected to the BEOL structure 100. As another example, the metal line itself may be an MOL element such as a gate contact structure connected to a gate electrode of a transistor or a source/drain contact structure connected to a source/drain region of the transistor included in the semiconductor device. Thus, the BEOL structure 100 may be actually a combination of a BEOL structure and an MOL structure.

The BEOL structure 100 shown in FIG. 1 includes five layers L1 to L5 stacked in a D3 direction, and a plurality of metal lines and a plurality of vias are respectively formed in the layers L1 to L5.

Referring to FIG. 1, a lower metal layer L1 includes a lower metal line M1 that may be connected to a transistor structure TR formed therebelow. The transistor structure TR may include one or more MOL and FEOL elements of a transistor such as a fin field-effect transistor (FinFET) or a nanosheet transistor which is also referred to as multi-bridge channel field-effect transistor (MBCFET). FIG. 1 also shows that an upper metal layer L5 includes an upper metal line M3 which may receive a power signal or may be used for internal signal routing of the semiconductor device. For example, the lower metal line M1 or the upper metal line M3 may be used as a power line, a gate contact structure, or a source/drain region contact structure of the transistor structure TR, not being limited thereto. The lower metal line M1 and the upper metal line M3 may each be formed in respective trenches (not shown) extended in a D1 direction.

FIG. 1 further shows that a $1^{st}$ via layer L2, a $2^{nd}$ metal layer L3 and a $2^{nd}$ via layer L4 are sequentially stacked in the D3 direction between the lower metal layer L1 and the upper metal layer L5. The $2^{nd}$ metal layer L3 includes a plurality $2^{nd}$ metal lines M21 to M24 which are formed in respective trenches T1 to T4 extending in a D2 direction perpendicular to the D1 direction. The $2^{nd}$ metal lines M21 to M24 may also be used to receive a power signal or may be used for internal signal routing of the semiconductor device. The $2^{nd}$ metal lines M21 and M23 are vertically connected to the lower metal line M1 through $1^{st}$ vias V11 and V12, respectively, formed in respective $1^{st}$ via holes VH11 and VH12 provided in the $1^{st}$ via layer L2. Each of the $1^{st}$ via holes VH11 and VH12 has an aspect ratio of width w1 to height h1. The other $2^{nd}$ metal lines M22 and M24 are vertically connected to the upper metal line M3 through $2^{nd}$ vias V21 and V22, respectively, formed in respective $2^{nd}$ via holes VH21 and VH22 in the $2^{nd}$ via layer L4.

The plurality of metal lines and vias formed in the layers L1 to L5 may be formed of the same or different metals or metal compounds including at least one of copper (Cu), titanium (Ti), tantalum (Ta), aluminum (Al), tungsten (W), cobalt (Co), molybdenum (Mo), ruthenium (Ru), etc.

Further, the BEOL structure 100 includes $1^{st}$ to $3^{rd}$ interlayer dielectric (ILD) structures ILD1 to ILD3 respectively formed in the $2^{nd}$ to 4th layers L2 to L4 to respectively isolate or insulate the $1^{st}$ vias V11 and V12, the $2^{nd}$ metal lines M21 to M24, and the $2^{nd}$ vias V21 and V22 from one another or from horizontally neighboring circuit elements (not shown). The $1^{st}$ to $3^{rd}$ ILD structures ILD1 to ILD3 may be formed of at least one of low-k materials such as silicon, carbon, silicon oxide and silicon nitride. The low-k material may have a dielectric constant (k value) that is about 3.9 or less. These ILD structures ILD1 to ILD3 may include at least one of oxide, nitride and oxynitride.

As a higher device density is required for an improved integrated circuit, a horizontal space margin between neighboring metal lines and/or vias is decreasing. Accordingly, a short-circuit risk often arises between a metal line formed in a metal layer and an under-layer via. For example, as shown in FIG. 1, a horizontal distance w2 between an upper-right edge of the $1^{st}$ via hole VH11 and a lower-left edge of the trench T2 becomes very small to meet device density requirements. Consequentially, the $1^{st}$ via V11 formed in the $1^{st}$ via hole VH11 and the $2^{nd}$ metal line M22 formed in the trench T2 has a very small horizontal space margin CD1, which increases a risk of short circuit therebetween during a manufacturing process of the BEOL structure 100.

Thus, there is demand of an improved connection structure or BEOL structure for a semiconductor device and a method of manufacturing the same.

Information disclosed in this Background section has already been known to the inventors before achieving the embodiments of the present application or is technical information acquired in the process of achieving the embodiments described herein. Therefore, it may contain information that does not form prior art that is already known to the public.

SUMMARY

The disclosure provides a connection structure for an integrated circuit which includes a spacer via structure, and a method of manufacturing the connection structures.

According to embodiments, there is provided a connection structure for an integrated circuit which may include: a $1^{st}$ layer including a $1^{st}$ metal line; a $2^{nd}$ layer, above the $1^{st}$ layer, including a $1^{st}$ via; and a $3^{rd}$ layer, above the $2^{nd}$ layer, including a $2^{nd}$ metal line connected to the $1^{st}$ metal line through the $1^{st}$ via, wherein the $1^{st}$ via includes a spacer structure at a side of an upper portion of the $1^{st}$ via, the spacer structure comprising an insulation material.

According to embodiments, the $1^{st}$ via may be formed in a $1^{st}$ via hole formed in the $2^{nd}$ layer, and the spacer structure may be formed on an upper side surface of the $1^{st}$ via hole. Further, the spacer structure may be disposed between the upper portion of the $1^{st}$ via and the upper side surface of the $1^{st}$ via hole.

According to embodiments, there is provided a connection structure for an integrated circuit which may include: a $1^{st}$ layer including a $1^{st}$ metal line; a $2^{nd}$ layer, above the $1^{st}$ layer, including a $1^{st}$ via; and a $3^{rd}$ layer, above the $2^{nd}$ layer, including a $2^{nd}$ metal line connected to the $1^{st}$ metal line through the $1^{st}$ via, wherein the $1^{st}$ via includes an upper portion and a lower portion connected to the upper portion, and a width of a bottom surface of the upper portion is smaller than a width of a top surface of the lower portion contacting the bottom surface of the upper portion, in a first direction.

According to embodiments, there is provided a method of manufacturing a connection structure for an integrated circuit. The method may include: forming a $1^{st}$ layer including a $1^{st}$ metal line; forming a $2^{nd}$ layer, above the $1^{st}$ layer, including an initial via structure vertically connected to the $1^{st}$ metal line; removing an upper portion of the initial via structure from the $2^{nd}$ layer to form a hole exposing a top surface of a lower portion of the initial via structure; forming a spacer layer along a side surface of the hole; and filling the hole with a via material to be combined with the lower portion of the initial via structure to form a $1^{st}$ via in the $1^{st}$ via layer.

According to embodiments, the $3^{rd}$ layer may be formed to further include a 3rd metal line such that the $3^{rd}$ layer is isolated from the $1^{st}$ via, and includes a protrusion in a form of via, wherein the $3^{rd}$ metal line has a height greater than the $2^{nd}$ metal line by a height of the protrusion.

BRIEF DESCRIPTION OF DRAWINGS

Example embodiments of the disclosure will be more clearly understood from the following detailed description taken in conjunction with the accompanying drawings in which:

FIG. 7 illustrates a flowchart of a plurality of operations of a method for manufacturing a BEOL structure including a spacer via structure, according to an embodiment;

FIG. 8 illustrates a flowchart of a plurality of operations of a method for manufacturing a BEOL structure including a spacer via structure and a top via structure, according to an embodiment.

DETAILED DESCRIPTION OF EMBODIMENTS

Figure 1:
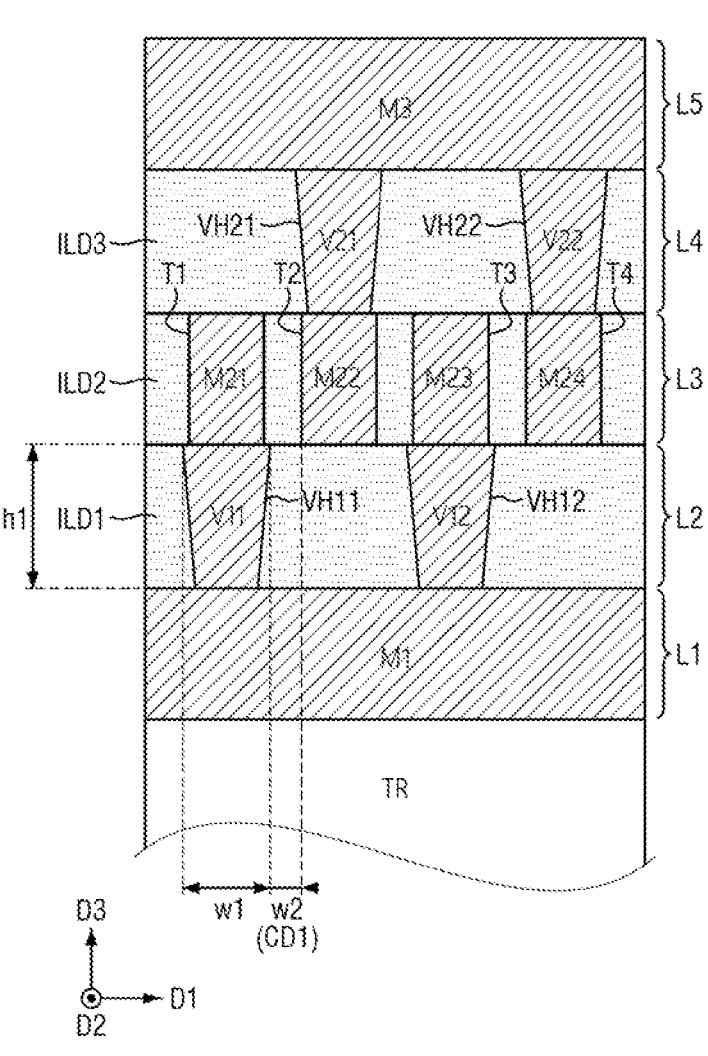
FIG. 1 illustrates a cross-sectional view of a back-end-of-line (BEOL) structure including a plurality of metal lines and vias formed in a plurality of layers.

The embodiments of the disclosure described herein are example embodiments, and thus, the disclosure is not limited thereto, and may be realized in various other forms. Each of the embodiments provided in the following descriptions is not excluded from being associated with one or more features of another example or another embodiment also provided herein or not provided herein but consistent with the disclosure. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the disclosure are intended to encompass structural and functional equivalents thereof. In addition, these equivalents should be understood as including not only currently well-known equivalents but also equivalents to be developed in the future, that is, all devices invented to perform the same functions regardless of the structures thereof. For example, a material or materials forming a metal line or a via may not be limited to metals of which examples are taken herein as long as the disclosure can be applied thereto. Further, the use of the via structure or the via scheme described herein may not be limited to a BEOL or MOL of a semiconductor device, and instead, may be applied to a different structure or device.

It will be understood that when an element, component, layer, pattern, structure, region, or so on (hereinafter collectively "element") of a semiconductor device is referred to as being "over," "above," "on," "below," "under," "beneath," "connected to" or "coupled to" another element in the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there may be no intervening elements present. Like numerals refer to like elements throughout this disclosure.

Spatially relative terms, such as "over," "above," "on," "upper," "below," "under," "beneath," "lower," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

It will be also understood that, even if a certain step or operation of manufacturing an apparatus or structure is described later than another step or operation, the step or operation may be performed later than the other step or operation unless the other step or operation is described as being performed after the step or operation.

Many embodiments are described herein with reference to cross-sectional illustrations that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept. Further, in the drawings, the sizes and relative sizes of layers and regions may be exaggerated for clarity.

For the sake of brevity, conventional elements of an integrated circuit, a semiconductor device and a connection structure such as a BEOL or MOL structure may or may not be described in detail herein or shown in the drawings. For example, a barrier metal line formed in a via hole or a trench before a via or a metal line is formed therein may not be shown in the drawings. An etch stop layer formed between two vertically adjacent layers may also not be shown in the drawings. Thus, a height, width or length of a layer, a metal line or a via formed in the layer as described herein and shown in the drawings may include that of the barrier metal line and/or an etch stop layer.

A small via scheme has been introduced to address the above problems occurring from the BEOL structure 100 in which a short circuit risk is high due to the small horizontal space margin between a metal line and an under-layer via.

Figure 2:
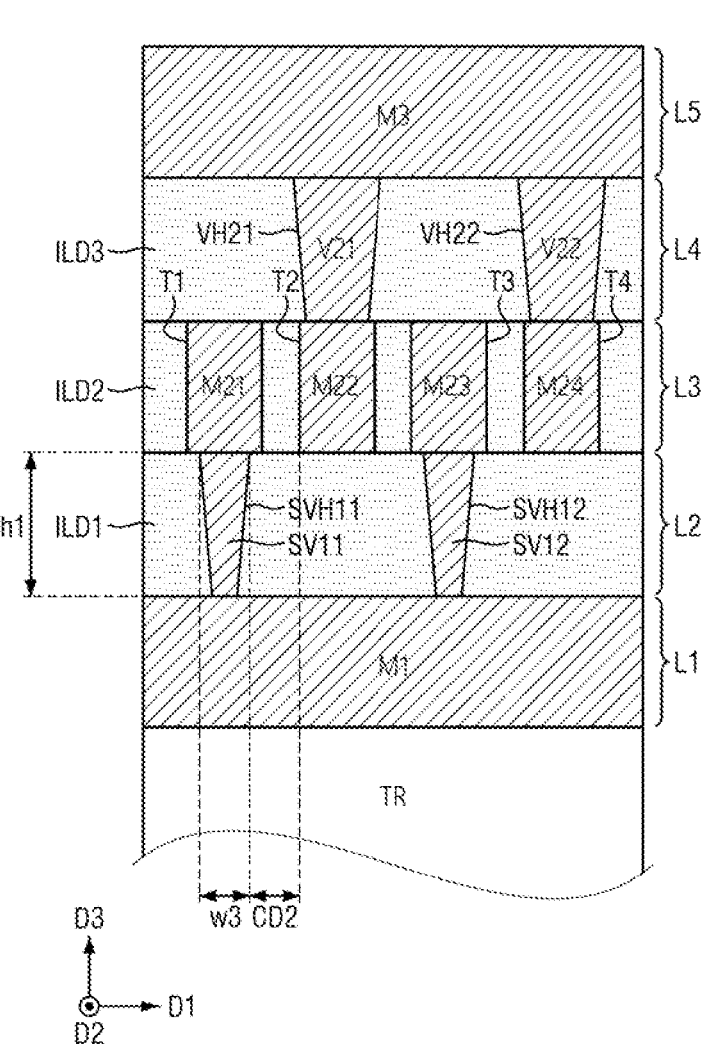
FIG. 2 illustrates a cross-sectional view of a BEOL structure including a small via structure, according to an embodiment.

FIG. 2 illustrates a cross-sectional view of a BEOL structure including a small via structure, according to an embodiment.

In order to address the problem of a short-circuit risk that may occur in the BEOL structure 100 as described in reference FIG. 1, a small via scheme is introduced in a BEOL structure 200 as shown in FIG. 2.

Referring to FIG. 2, the BEOL structure 200 may include the same elements of the BEOL structure 100 shown in FIG. 1 except two small vias SV11 and SV12 in the $1^{st}$ via layer L2. Thus, duplicate descriptions are omitted, and only different aspects of the BEOL structure 200 are described herebelow.

In the BEOL structure 200, the two small vias SV11 and SV12 may replace the $1^{st}$ vias V11 and V12 of the BEOL structure 100 shown in FIG. 1, according to an embodiment.

These two small vias SV11 and SV12 may be formed in two small via holes SVH11 and SVH12 having an aspect ratio of width w3 to height h1 which is greater than the aspect ratio of width w1 to height h1 of the $1^{st}$ via holes VH11 and VH12 in the BEOL structure 100 as shown in FIG. 1. That is, in this example, the width w3 of a top surface of each of the two small vias SV11 and SV12 is smaller than the width w1 of the top surface of each of the $1^{st}$ vias V11 and V12, although the two small vias SV11 and SV12 have the same height h1 as the $1^{st}$ vias V11 and V12 of the BEOL structure 100.

Due to the above structural difference, a horizontal space margin CD2 between the small via SV11 and the $2^{nd}$ metal line M22 becomes greater than the corresponding horizontal space margin CD1 between the $1^{st}$ via V11 and the $2^{nd}$ metal line M22 of the BEOL structure 100 shown in FIG. 1. Accordingly, it may be possible to reduce the risk of short circuit that may occur between the $2^{nd}$ metal line M22 and each of the small vias SV11 and SV12.

However, the greater aspect ratio of width w3 to height h1 may cause difficulties in a reactive ion etching process to obtain the small via holes SVH11 and SVH12 that accommodate the small vias SV11 and SV12 therein, respectively. Further, a void may be generated inside the small via holes SVH11 and SVH12 during metallization of the small vias SV11 and SV12 because of the greater aspect ratio. Further, this manufacturing difficulty may incur misalignment or disconnection of the small vias SV11 and SV12 with the upper-layer metal lines M21 and M23 or the lower-layer metal line M1.

Thus, a different type of via structure is also introduced herebelow to address the short-circuit risk of the $1^{st}$ vias V11 and V12 of the BEOL structure 100 and the problems of misalignment or disconnection and void phenomenon of the small vias SV11 and SV12 of the BEOL structure 200.

Figure 3:
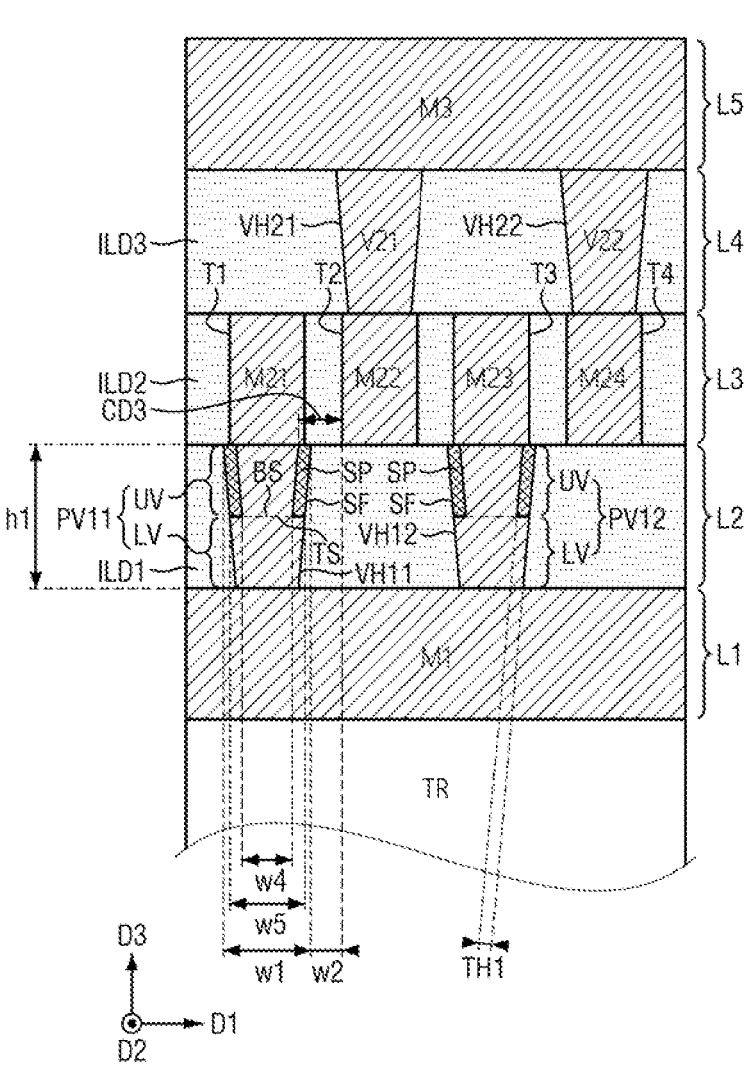
FIG. 3 illustrates a cross-sectional view of a BEOL structure including a spacer via structure, according to an embodiment.

FIG. 3 illustrates a cross-sectional view of a BEOL structure including a spacer via structure, according to an embodiment.

Referring to FIG. 3, a BEOL structure 300 includes the same elements of the BEOL structures 100 and 200 of FIGS. 1 and 2 except via structures formed in the $1^{st}$ via layer L2. Thus, duplicate descriptions are omitted, and only different aspects of the BEOL structure 300 are described herebelow.

In the BEOL structure 300, $1^{st}$ vias PV11 and PV12 may replace the $1^{st}$ vias V11 and V12 of the BEOL structure 100 shown in FIG. 1 or the two small vias SV11 and SV12 of the BEOL structure 200 shown in FIG. 2, according to an embodiment.

FIG. 3 shows that the two vias PV11 and PV12 are respectively formed in two $1^{st}$ via holes VH11 and VH12 provided in the $1^{st}$ via layer L2. According to an embodiment, a spacer structure SP may be formed on a side surface SF of an upper portion of each of the $1^{st}$ via holes VH11 and VH12 in which the $1^{st}$ vias PV11 and PV12 are filled, respectively. The spacer structure SP may be formed of an insulation material such as silicon nitride (SiN), not being limited thereto, according to an embodiment. The spacer structures SP may have a horizontal thickness TH1 in the D1 direction on the upper side surface SF of each of the $1^{st}$ via holes VH11 and VH12.

As the spacer structures SP is formed in each of the $1^{st}$ via holes VH11 and VH12, respectively, as described above, each of the $1^{st}$ vias PV11 and PV12 may take a form of via with the spacer structure SP formed on a side surface of an upper portion UV thereof. The spacer structure SP having the horizontal thickness TH1 may directly contact the upper side surface SF of each of the $1^{st}$ via holes VH11 and VH12 and the corresponding side surface of the upper portion UV of each of the $1^{st}$ vias PV11 and PV12.

Thus, even if the horizontal distance w2 between the upper-right edge of the $1^{st}$ via hole VH11 and the lower-left edge of the trench T2 is very small, a horizontal space margin CD3 between the $1^{st}$ via PV11 and the $2^{nd}$ metal line M22 may be greater than the horizontal space margin CD1 between the $1^{st}$ via V11 and the $2^{nd}$ metal line M22 of the BEOL structure 100 shown in FIG. 1 due to the spacer structure SP, and thus, the short-circuit risk may be reduced in the BEOL structure 300 compared to the BEOL structure 100. Further, the $1^{st}$ via holes VH11 and VH12 in the BEOL structure 300 are the same as the $1^{st}$ via holes VH11 and VH12 of the BEOL structure 100 in FIG. 1, which has a greater aspect ratio that the small via holes SVH11 an SVH12 of the BEOL structure 200 in FIG. 2. Thus, the BEOL structure 300 may overcome the problems of the small via structure, that is, a possible void phenomenon in the small via holes and misalignment or disconnection between the small vias and upper-layer or lower-layer metal lines.

In the meantime, as described later for a method of manufacturing a BEOL structure, the upper portion UV of each of the $1^{st}$ vias PV11 and PV12 may be formed at a different time from a lower portion LV of each of the $1^{st}$ vias PV11 and PV12. Each of the $1^{st}$ vias PV11 and PV12 may have a connection surface formed of a bottom surface BS of the upper portion UV and a top surface TS of the lower portion LV contacting or connected to the bottom surface BS of the upper portion UV. In this case, as the spacer structure SP is formed on the upper side surface SF of each of the $1^{st}$ via holes VH11 and VH12, a horizontal width w4 of the bottom surface BS of the upper portion UV may be smaller than a horizontal width w5 of the top surface TS of the lower portion LV in the D1 direction, as shown in FIG. 3.

In the meantime, the above spacer via structure may also be used in a BEOL structure including a top via structure, according to embodiments.

Figure 4A:
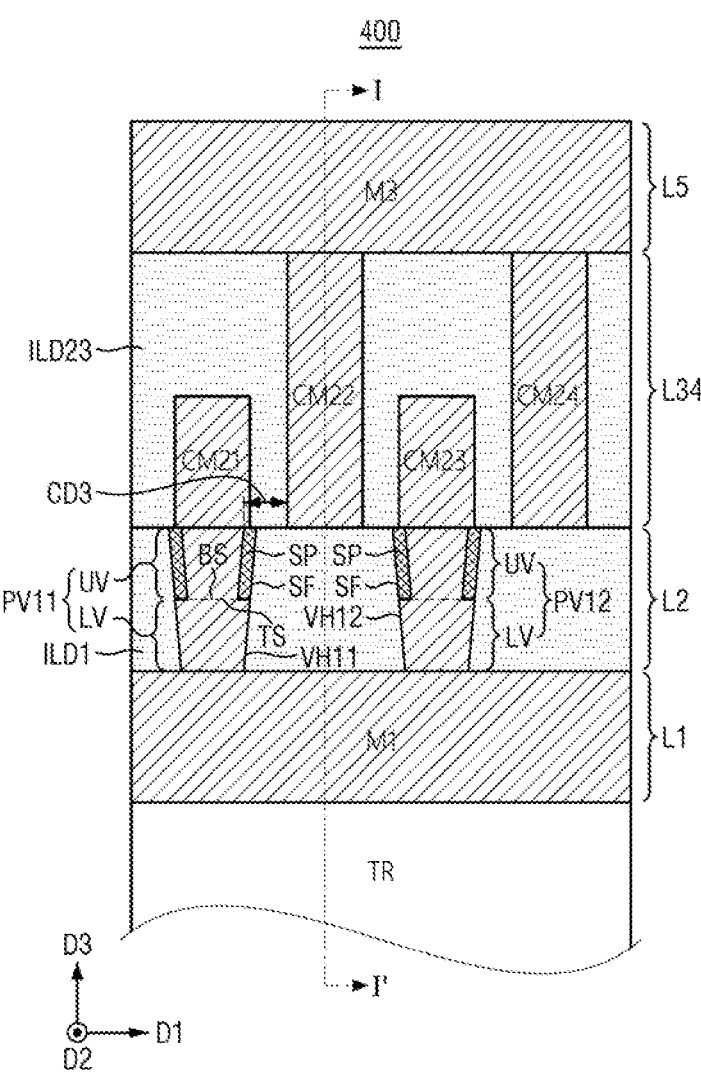
FIG. 4A illustrates a cross-sectional view of a BEOL structure including a spacer via structure and a top via structure, according to an embodiment.
Figure 4B:
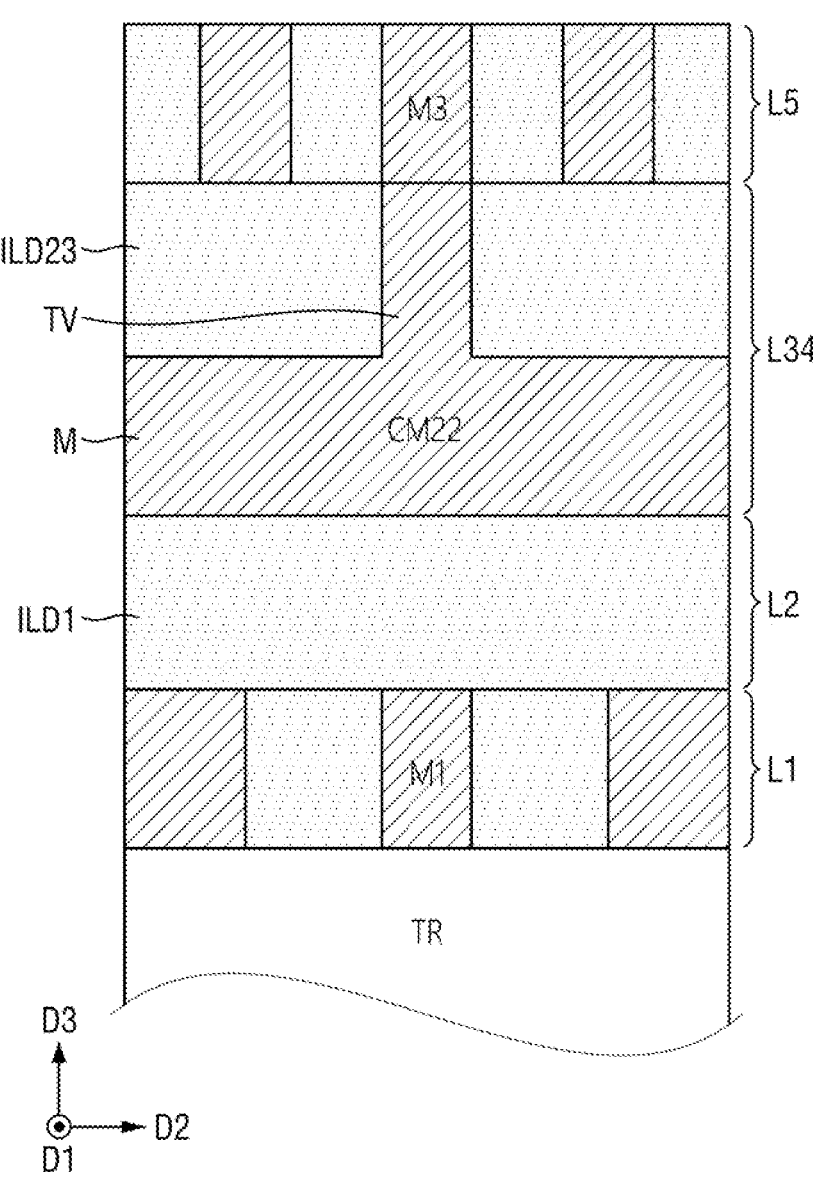
FIG. 4B illustrate a cross-sectional view of the BEOL structure shown in FIG. 4A taken a line I-I' shown in FIG. 4A.

FIG. 4A illustrates a cross-sectional view of a BEOL structure including a spacer via structure and a top via structure, according to an embodiment. FIG. 4B illustrate a cross-sectional view of the BEOL structure shown in FIG. 4A taken a line I-I' shown in FIG. 4A.

Referring to FIGS. 4A and 4B, a BEOL structure 400 includes the same elements of the BEOL structures 300 of FIG. 3 except metal line and via structure formed in layers stacked above the $1^{st}$ via layer L2. Thus, duplicate descriptions are omitted, and only different aspects of the BEOL structure 200 are described herebelow.

Like the BEOL structure 300, the BEOL structure 400 shown in FIGS. 4A and 4B may also include via holes with a spacer structure on their upper side surfaces. Thus, each of the $1^{st}$ via holes VH11 and VH12 in the $1^{st}$ via layer L2 of the BEOL structure 400 may also have the spacer structure SP on the side surface SF of its upper portion, similar to the BEOL structure 300. The BEOL structure 400 may also have a reduced short-circuit risk between the $1^{st}$ via PV11 or PV12 and an upper-layer metal line.

However, the BEOL structure 400 may include a metal/via layer L34 in which hybrid metal lines CM21 to CM24 are formed in a middle ILD structure ILD23. This metal/via layer L34 of the BEOL structure 400 corresponds to a combination of the $2^{nd}$ metal layer L3 and the $2^{nd}$ via layer L4 of the BEOL structures 100 to 300 in which the $2^{nd}$ metal lines M21 to M24 and the $2^{nd}$ vias V21 and V22 are formed, respectively. The middle ILD structure ILD23 correspond to the $2^{nd}$ ILD structure ILD2 and the $3^{rd}$ ILD structure ILD3.

According to an embodiment, the hybrid metal lines CM21 and CM23 of the BEOL structure 400 correspond to the $2^{nd}$ metal lines M21 and M23 in the $2^{nd}$ metal layer L3 of the BEOL structure 300, and thus, may also be connected to the under-layer vias PV 11 and PV12 like in the BEOL structure 300. However, these hybrid metal lines CM21 and CM23 may be formed through one or more operations different from those for forming the $2^{nd}$ metal lines M21 and M23 of the BEOL structure 300, as will be described later.

Further, each of the hybrid metal lines CM22 and CM24 may be formed as a single continuous structure including a metal line M and a top via TV in the metal/via layer L34. This is because the single continuous structure of the metal line M and the top via V of each of the hybrid metal lines CM22 and CM24 may be formed in a single step during a manufacturing process of the BEOL structure 400. Thus, unlike the combination of the $2^{nd}$ metal line M22 (or M24) and the $2^{nd}$ via V21 (or V22) in FIGS. 1 to 3, each of the hybrid metal lines CM22 and CM24 may not have therein a connection surface such as a top surface of the $2^{nd}$ metal line M22 and a bottom surface of the $2^{nd}$ via V21 contacting or facing each other in the BEOL structures 100 to 300.

Although the metal line M and the top via TV may be a single continuous structure formed in a single step, the top via TV may be distinguished from the metal line M in each of the hybrid metal lines CM22 and CM24 in its shape as shown in FIG. 4B in reference to FIG. 4A. FIG. 4B shows that the top via TV takes a form of protrusion or protruded pillar from the metal line M extended in the D2 direction without a connection surface therebetween.

Here, the metal line M of each of the hybrid metal lines CM22 and CM24 may have a same height as each of the hybrid metal lines CM21 and CM23 in the D3 direction. Thus, each of the hybrid metal lines CM22 and CM24 have a greater height than each of the hybrid metal lines CM 21 and CM23 by a height of the top via TV.

The middle ILD structure ILD23 may also be formed in a single step during the manufacturing process of the BEOL structure 400. Thus, unlike the combination of the $2^{nd}$ ILD structure ILD2 and the $3^{rd}$ ILD structure ILD3 in FIGS. 1 to 3, the middle ILD structure 23 may not have therein a connection surface such as a bottom surface of the $2^{nd}$ ILD structure ILD2 and a top surface of the $3^{rd}$ ILD structure ILD3 contacting or facing each other in the BEOL structures 100 to 300.

According to an embodiment, the top via TV may be referred to as such because it takes of a form of protrusion or a protruded pillar from the metal line M. Thus, there is no connection surface between the top via TV and the metal line M in each of the hybrid metal lines CM22 and CM24 of the BEOL structure 400.

Still, in the present embodiment, an under-layer via with a spacer structure may be used to form a BEOL structure having a reduced short-circuit risk between a metal line and the under-layer via.

Herebelow, methods of manufacturing BEOL structures having a spacer via structure are described according to embodiments.

FIGS. 5A to 5G illustrate cross-sectional views of a plurality of operations of a method for manufacturing a BEOL structure including a spacer via structure, according embodiments.

The BEOL structure manufactured by the method described below may be or correspond to the BEOL structure 300 shown in FIG. 3. Thus, the same or like reference numbers shown in FIG. 3 may be used in the descriptions herebelow.

Figure 5A:
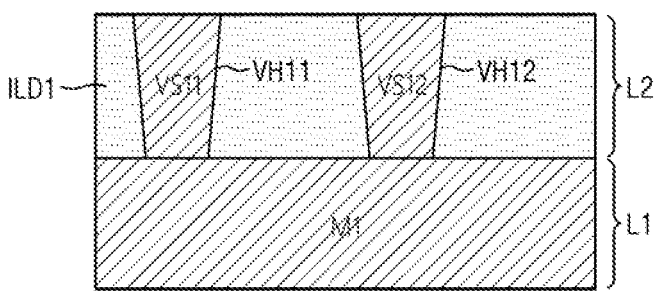
FIGS. 5A to 5G illustrate cross-sectional views of a plurality of operations of a method for manufacturing a BEOL structure including a spacer via structure, according to embodiments.

Referring to FIG. 5A, a lower metal layer L1 and a $1^{st}$ via layer L2 stacked on the lower metal layer L1 may be formed, in which a lower metal line M1 and two via structures VS11 and VS22 may be formed, respectively.

The lower metal line M1 and the via structures VS11 and VS22 may be formed through a couple of single damascene operations or a dual damascene operation including a lithography process so that the two via structures VS11 and VS22 may be connected to the lower metal line M1, and top surfaces of the two via structures VS11 and V22 are exposed upward, according to an embodiment.

The $1^{st}$ via layer L2 may further include a $1^{st}$ ILD structure ILD1 which isolates the two via structures VS11 and VS22 respectively filled in $1^{st}$ via holes VH11 and VH12 in the $1^{st}$ via layer L2.

Figure 5B:
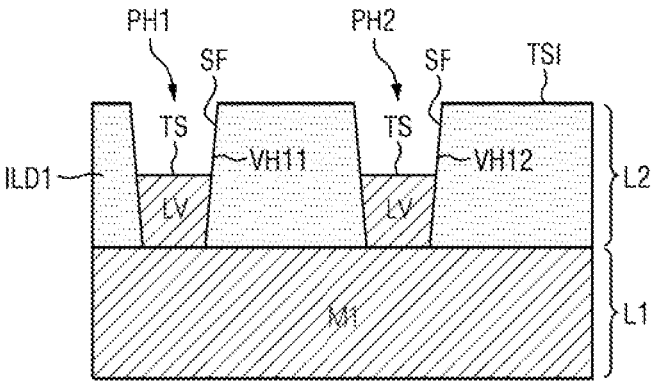

Referring to FIG. 5B, an upper portion of each of the via structures VS11 and VS22 may be removed to expose a top surface TS of a lower portions LV of each of the $1^{st}$ via structures VS11 and VS12, and a side surface SF of an upper portion of each of the $1^{st}$ via holes VH11 and VH12, thereby forming half-via holes PH1 and PH2. Here, the side surface SF of the upper portion of each of the $1^{st}$ via holes VH11 and VH12 is formed of the $1^{st}$ ILD structure ILD1. Thus, an inner surface of the half-via hole PH1 (or PH2) may include the top surface TS of the lower portion LV of the via structure VS11 (or VS12) and the side surface SF of the $1^{st}$ vial hole VH11 (or VH12).

This partial etching of the via structures VS11 and VS12 may be performed by, for example, dry etching such as reactive ion etching, not being limited thereto, according to an embodiment.

Figure 5C:
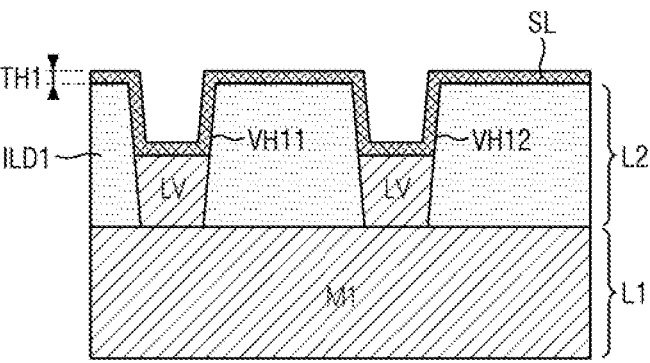

Referring to FIG. 5C, a spacer layer SL may be conformally formed along the inner surface of each of the half-via holes PH1 and PH2 and a top surface TSI of the $1^{st}$ ILD structure ILD1, according to an embodiment.

As the spacer layer SL is conformally formed as described above, the spacer layer SL may have a uniform thickness TH1 along the inner surface of each of the half-via holes PH1 and PH2 and the top surface TSI of the $1^{st}$ ILD structure ILD1. This conformal layering may be performed through, for example, a thin film deposition technique such as atomic layer deposition (ALD) of a material including silicon nitride (SiN), not being limited thereto, according to an embodiment.

Figure 5D:
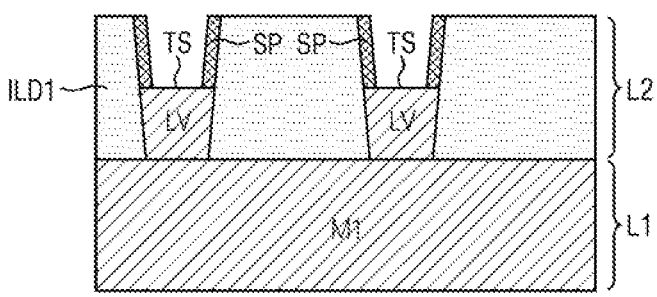

Referring to FIG. 5D, the spacer layer SL may be etched back on the top surface TS of the lower portion LV of each of the via structures VS11 and VS12 and the top surface TSI of the $1^{st}$ ILD structure ILD1, to leave the spacer layer SL as a spacer structure SP on the side surface SF of each of the half-via holes PH11 and PH12.

This etch back operation may be performed anisotropically through, for example, ashing and/or dry etching such as reactive ion etching, not being limited thereto, according to an embodiment.

By this etch-back operation, the top surface TS of the lower portion LV of each of the via structures VS11 and VS12, except a portion covered by the spacer layer SL formed on the side surface SF of each of the half-via holes PH11 and PH12, may remain exposed. Further, this etch-back operation may expose the top surface TSI of the $1^{st}$ ILD structure ILD1 again.

Figure 5E:
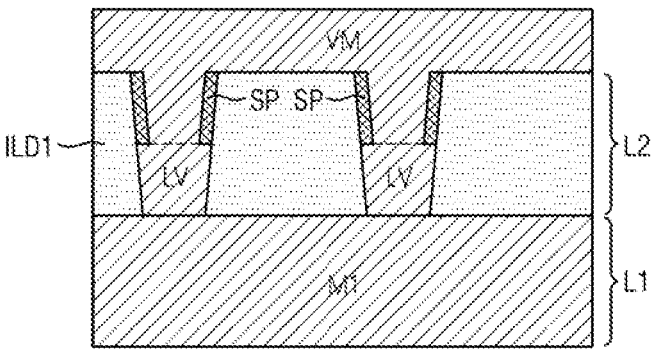

Referring to FIG. 5E, a vial metal VM may be deposited on the BEOL structure shown in FIG. 5 such that the via metal fills out the half-via holes PH11 and PH12 and covers the top surface TSI of the $1^{st}$ ILD structure ILD1 by, for example, physical vapor deposition (PVD), chemical vapor deposition (CVD), plasma enhanced CVD (PECVD), and/or electroplating, not being limited thereto. Here, the via metal VM may overfilled in the half-via holes and spread along the top surfaces of the $1^{st}$ ILD structure ILD1.

Figure 5F:
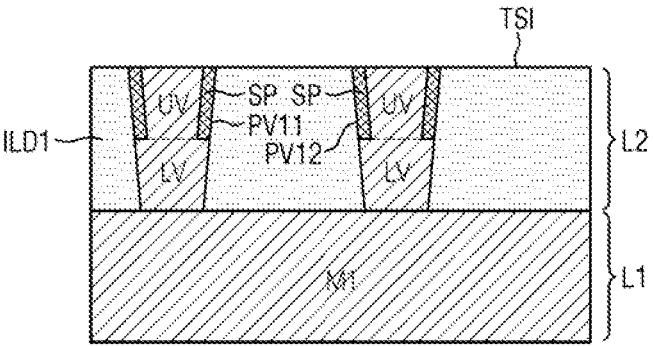

Referring to FIG. 5F, an excess of the via metal VM deposited above a level of the top surface TSI of the $1^{st}$ ILD structure ILD1 may be removed by, for example, a chemical-mechanical planarization (CMP) technique to obtain $1^{st}$ vias PV11 and PV12, respectively, in the $1^{st}$ via holes VH1 and VH2. Here, the spacer structure SP is formed on the upper side surface SF of each of the $1^{st}$ via holes VH11 and VH12.

As a result of removing the excess of the via metal VM, the remaining portion of the via metal VM filled in the half-via holes PH11 and PH22 may become upper portions UL of the $1^{st}$ vias PV11 and PV12, respectively, with the spacer structure SP on their side surfaces. Thus, a BEOL structure including the $1^{st}$ vias PV11 and PV12 isolated from the $1^{st}$ ILD structure ILD1 in the $1^{st}$ via layer L2 may be obtained.

Figure 5G:
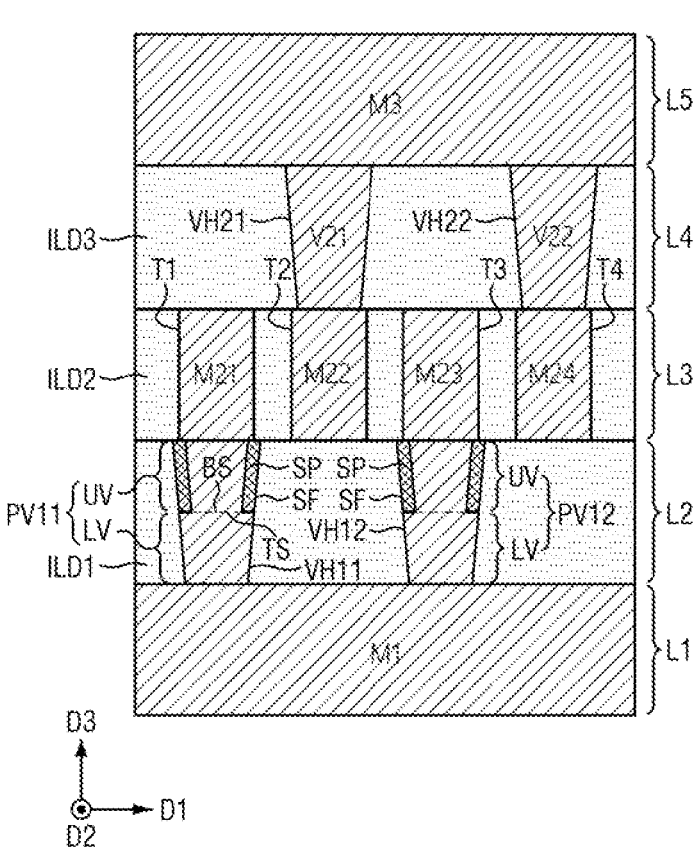

Referring to FIG. 5G, a $2^{nd}$ metal layer L3 including a plurality of $2^{nd}$ metal lines M21 to M24 may be formed. Subsequently, a $2^{nd}$ via layer L4 including $2^{nd}$ vias V21 and V22, and an upper metal layer L5 including an upper metal line M3 connected to the $2^{nd}$ vias V21 and V22 may be formed. In this operation, a $2^{nd}$ ILD structure ILD2 may be formed in the $2^{nd}$ metal layer L3 by which the $2^{nd}$ metal lines M21 to M24 are isolated from one another, and a $3^{rd}$ ILD structure ILD3 may be formed in the $2^{nd}$ via layer L4 by which the $2^{nd}$ vias V21 and V22 are isolated from each other.

The $2^{nd}$ ILD structure ILD2 may be formed before the $2^{nd}$ metal lines M21 and M24 are patterned therein in the $2^{nd}$ metal layer L3, and the $3^{rd}$ ILD structure ILD3 may also be formed before the $2^{nd}$ vias V21 and V22 are patterned therein in the $2^{nd}$ via layer L4, according to an embodiment.

The $2^{nd}$ metal layer L3, the $2^{nd}$ via layer L4 and the upper metal layer L5 including the above metal lines and vias may be formed by, for example, one or more single damascene or dual damascene operations such that the $2^{nd}$ metal lines M21 and M23 are connected to the lower metal line M1 through the $1^{st}$ vias PV11 and PV12, respectively, and the other $2^{nd}$ metal lines M22 and M24 are connected to the upper metal line M3 thorough the $2^{nd}$ vias V21 and V22, respectively. Here, as the $1^{st}$ vias PV11 and PV12 have a spacer structure on their upper side surfaces, the $1^{st}$ vias PV11 and PV12 may have a sufficient spacer margin to the other $2^{nd}$ metal lines M22 and M24, thereby reducing a short-circuit risk as described above in reference to FIG. 3.

According to the method described above, a BEOL structure with a spacer via structure may be formed to reduce the short-circuit risk, and further, possible misaligned connection of a metal line with an under-layer via and a void phenomenon that may occur when a small via is formed for the BEOL structure.

FIGS. 6A to 6G illustrate cross-sectional views of a plurality of operations of a method for manufacturing a BEOL structure including a spacer via structure and a top via structure, according to embodiments.

The BEOL structure manufactured by the method described below may be or correspond to the BEOL structure 400 shown in FIGS. 4A and 4B. Thus, the same or like reference numbers shown in FIG. 4 may be used in the descriptions herebelow.

Further, this manufacturing method may include the same operations described above in reference to FIGS. 5A to 5F. Thus, the operation described in reference to FIG. 6A may be performed based on the BEOL structure obtained in the operation described in reference to FIG. 5F.

Figure 6A:
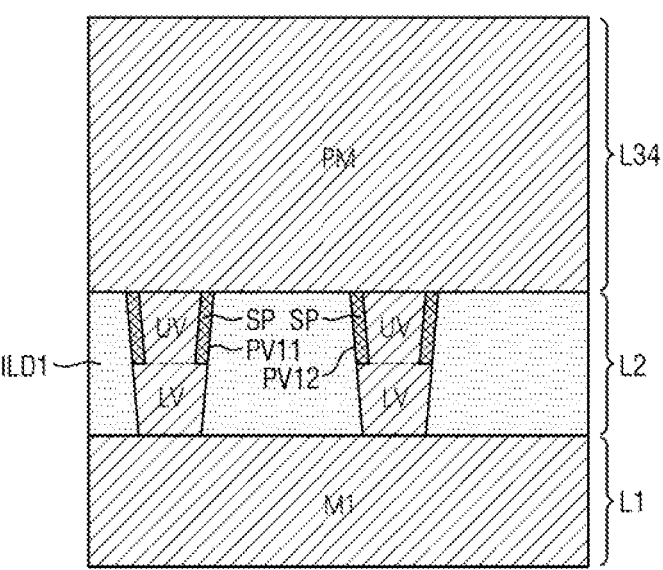
FIGS. 6A to 6G illustrate cross-sectional views of a plurality of operations of a method for manufacturing a BEOL structure including a spacer via structure and a top via structure, according to embodiments.

Referring to FIG. 6A, a preliminary metal PM may be deposited on a top surface of the BEOL structure shown in FIG. 5F to a predetermined thickness to form a metal/via layer L34. The deposition of the preliminary metal PM may be performing by, for example, PVD, CVD, PECVD, and electroplating, not being limited thereto.

Figure 6B:
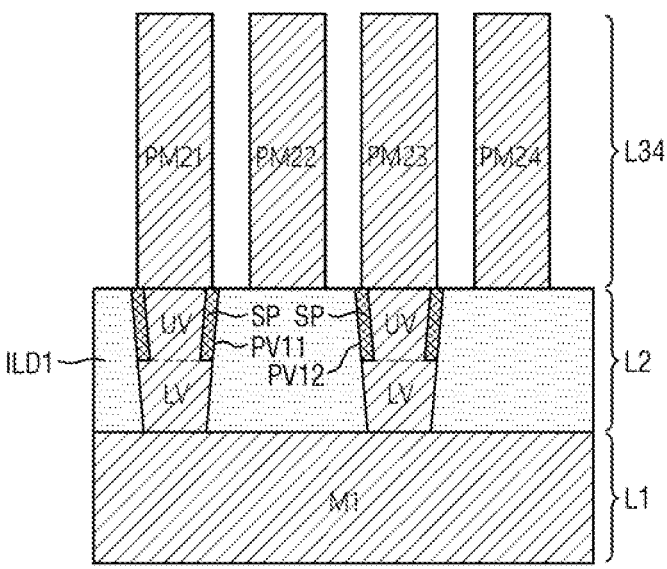

Referring to FIG. 6B, the preliminary metal PM deposited on the top surface of the BEOL structure to form the metal/via layer L34 may be patterned to form a plurality of preliminary hybrid metal lines PM21 to PM24 in the metal/via layer L34 through, for example, by a lithography and patterning process, not being limited thereto.

Among the preliminary hybrid metal lines PM21 to PM24, the preliminary hybrid metal lines PM21 and PM23 may be patterned at positions to be connected to the 1$^{st}$ vias PV11 and PV12, and the preliminary hybrid metal lines PM22 and PM24 may be patterned on a top surface of the ILD structure ILD1, according to an embodiment. Here, as the 1$^{st}$ vias PV11 and PV12 have a spacer structure on their upper side surfaces, the 1$^{st}$ vias PV11 and PV12 may have a sufficient spacer margin to the preliminary hybrid metal lines PM22 and PM24, thereby reducing a short-circuit risk as described above in reference to FIGS. 4A and 4B.

Figure 6C:
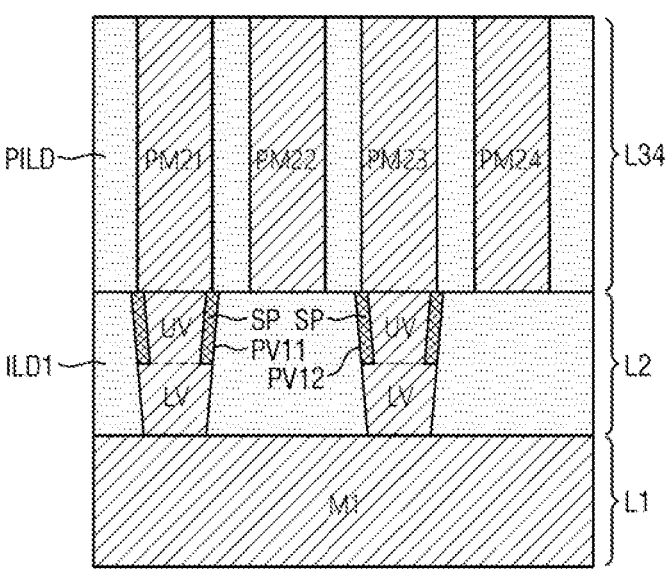

Referring to FIG. 6C, a preliminary middle ILD structure PILD may be formed between the preliminary hybrid metal lines PM21 to PM24 in the metal/via layer L34 by, for example, PVD, CVD and/or PECVD, not being limited thereto. Further, the preliminary middle ILD structure which are overfilled above a level of top surfaces of the preliminary hybrid metal lines PM21 to PM24 may be removed by planarization by, for example, a CMP technique so that a top surface of the preliminary middle ILD structure PIID is coplanar with top surfaces of the preliminary hybrid metal lines PM22 and PM24.

Figure 6D:
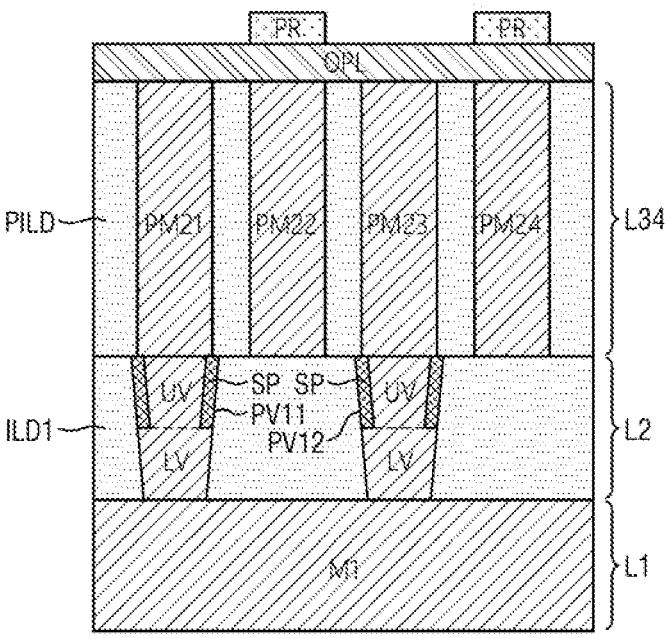

Referring to FIG. 6D, an organic planarization layer OPL and photoresist patterns PR may be formed on the metal/via layer L34 including the preliminary middle ILD structure PILD for a lithography process, according to an embodiment. The organic planarization layer OPL may include carbon, hydrogen, oxide, nitride and/or silicon, and the photoresist patterns PR may include an epoxy polymer, not being limited thereto, according to an embodiment.

The photoresist patterns PR may be disposed on the organic planarization layer OPL at positions below which the preliminary hybrid metal lines PM22 and PM24 are disposed in the metal/via layer L34. At these positions, top vias are to be patterned out from the preliminary hybrid metal lines PM22 and PM24 in a later operation.

Figure 6E:
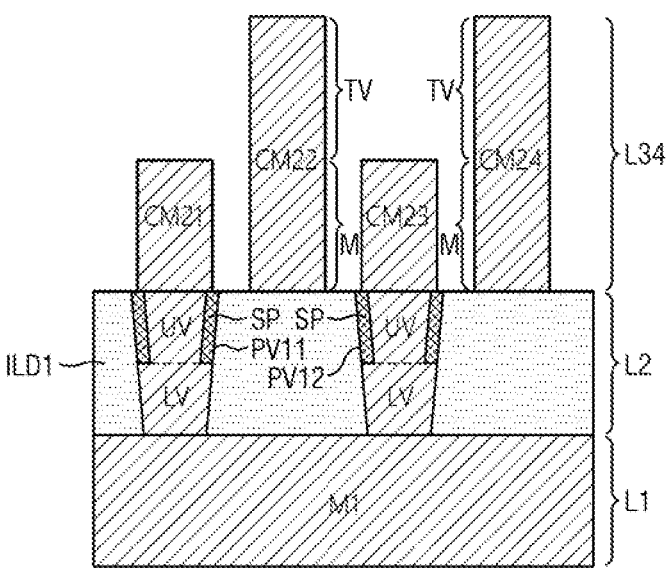

Referring to FIG. 6E, an upper portion of each of the preliminary hybrid metal lines PM21 and PM23 may be etched out based on the photoresist patterns PR and the organic planarization layer OPL by, for example, dry etching such as reactive ion etching. By this operation, hybrid metal lines CM21 and CM23, connected to the 1$^{st}$ vias V11 and V12, may be obtained from the preliminary hybrid metal lines PM21 and PM23 in the metal/via layer L34.

Further, the preliminary hybrid metal lines PM22 and PM24 may be patterned based on the photoresist patterns PR and the organic planarization layer OPL by, for example, another dry etching such as reactive ion etching. By this operation, a top via TV may be obtained from an upper portion of each of the preliminary hybrid metal lines PM22 and PM24, and thus, hybrid metal lines CM22 and CM24, each of which includes the top via TV and a metal line M below the top via TV, are formed in the metal/via layer L34.

Figure 6F:
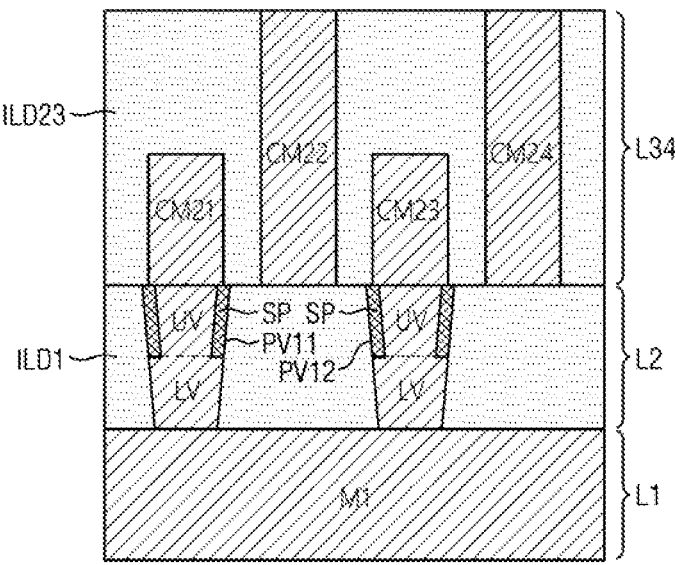

Referring to FIG. 6F, a middle ILD structure ILD23 may be formed in the metal/via layer L34 in which the hybrid metal lines CM21 to CM24 are formed by, for example, PVD, CVD, PECVD, and/or electroplating, not being limited thereto, and an overfilled portion of the middle ILD structure ILD 23 may be removed by planarization using, for example, a CMP technique to expose top surfaces of the top vias TV of the hybrid metal lines CM22 and CM24.

Figure 6G:
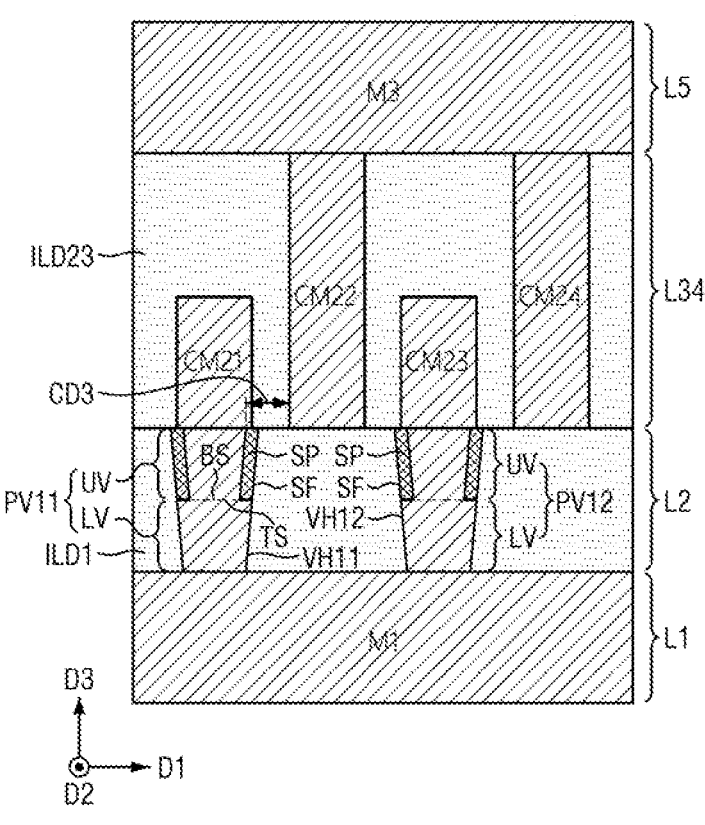

Referring to FIG. 6G, an upper metal line L5 in which an upper metal line M3 is formed may be stacked on the metal/via layer L34. The upper metal line M3 may be formed through, for example, a single damascene process, not being limited thereto, according to an embodiment. The upper metal line M3 may be connected to the hybrid metal lines CM22 and CM24 though the respective top vias TV of the hybrid metal lines CM22 and CM24.

FIG. 7 illustrates a flowchart of a plurality of operations of a method for manufacturing a BEOL structure including a spacer via structure, according to an embodiment.

In operation S10, a lower metal layer including a lower metal line may be provided, and a 1$^{st}$ via layer including a 1$^{st}$ ILD structure, a plurality of 1$^{st}$ via holes formed therein, and 1$^{st}$ via structures filled in the via holes may be stacked on the lower metal layer, thereby to form an initial BEOL structure.

In operation S20, an upper portion of each of the 1$^{st}$ via structures in the 1$^{st}$ via layer may be removed to form a plurality of half-via holes exposing a top surface of a lower portion of each of the 1$^{st}$ via structures and an upper side surface of each of the 1$^{st}$ via holes.

In operation S30, a spacer layer may be conformally formed along an inner surface of each of the half-via holes and a top surface of the 1$^{st}$ ILD structure. Here, the inner surface of each of the half-via hole is formed of the top surface of the lower portion of each of the 1$^{st}$ via structure and the upper side surface of each of the 1$^{st}$ via holes.

In operation S40, the spacer layer may be etched back from the top surface of the 1$^{st}$ ILD structure and the inner surface of each of the half-via holes except a side surface of each of the half-via holes, thereby obtaining a spacer structure formed on a side surface of each of the half-via holes.

In operation S50, a via metal may be formed on the initial BEOL structure obtained in operation S40 so that the via metal can fill out the half-via holes and cover a top surface of the 1$^{st}$ ILD structure. Here, the via metal may be overfilled in the half-via holes.

In operation S60, the overfilled via metal may be planarized to obtain a plurality of 1$^{st}$ vias in the via holes with the spacer structure on their upper side surfaces in the 1$^{st}$ via layer. Here, the planarization may be performed by etching back the overfilled via metal above a level of the top surface of the 1$^{st}$ ILD structure, so that the top surface of the 1$^{st}$ ILD structure is exposed upward and top surfaces of the $1^{st}$ vias may be coplanar with the top surface of the $1^{st}$ ILD structure.

In operation S70A, a $2^{nd}$ metal layer, a $2^{nd}$ via layer and an upper metal layer may be formed on the BEOL structure obtained in operation S60 through damascene operations, thereby to complete the BEOL structure. Here, the damascene operations are performed such that one or more $2^{nd}$ metal lines in the $2^{nd}$ metal layer are connected to the lower metal line in the lower metal layer through the $1^{st}$ vias, and another one or more $2^{nd}$ metal lines in the $2^{nd}$ metal layer are connected to an upper metal line in the upper metal layer M3 thorough one or more $2^{nd}$ vias in the $2^{nd}$ via layer, respectively.

The BEOL structure obtained through above operations S10 to S70A may be or correspond to the BEOL structure 300 shown in FIG. 3.

FIG. 8 illustrates a flowchart of a plurality of operations of a method for manufacturing a BEOL structure including a spacer via structure and a top via structure, according to an embodiment.

This manufacturing method may include the same operations S10 to S60 described above in reference to FIG. 7. Thus, duplicate descriptions are omitted herein, and instead, operations S70B to S120 following operation S60 are described herebelow.

In operation S70B, after the via metal is planarized to obtain the $1^{st}$ vias in the $1^{st}$ via holes with the spacer structure on their upper side surfaces in operation S60, a preliminary metal may be deposited on the BEOL structure obtained in operation S60 to form a metal/via layer above the $2^{nd}$ via layer, according to an embodiment.

In operation S80, the preliminary metal may be patterned to form a plurality of preliminary hybrid metal lines, some of which are connected to the $1^{st}$ vias in the $1^{st}$ via layer, according to an embodiment.

In operation S90, a preliminary middle ILD structure may be formed between the preliminary hybrid metal lines in the metal/via layer, according to an embodiment.

In operation S100, the metal/via layer including the preliminary hybrid metal lines may be patterned to remove an upper portion of each of the preliminary hybrid metal lines connected to the $1^{st}$ vias and obtain a top via from each of the preliminary hybrid metal lines not connected to the $1^{st}$ vias, and the preliminary ILD structure is removed from the metal/via layer, thereby to obtain a plurality of hybrid metal lines including top vias in the metal/via layer, according to an embodiment.

In operation S110, a middle ILD structure may be formed in the metal/via layer including the hybrid metal lines to isolate the hybrid metal lines from one another, according to an embodiment.

In operation S120, an upper metal layer including an upper metal line may be formed on the metal/via layer to connect the upper metal line with at least one of the hybrid metal lines in the metal/via layer, according to an embodiment.

Thus far, a number of connection structures including a spacer via structure have been described, where these connection structures form a BEOL structure for an integrated circuit. However, the connection structures described herein are not limited to a BEOL of an integrated circuit, and instead, may be applied to an MOL of a combination of a BEOL and an MOL of an integrated circuit.

Figure 9:
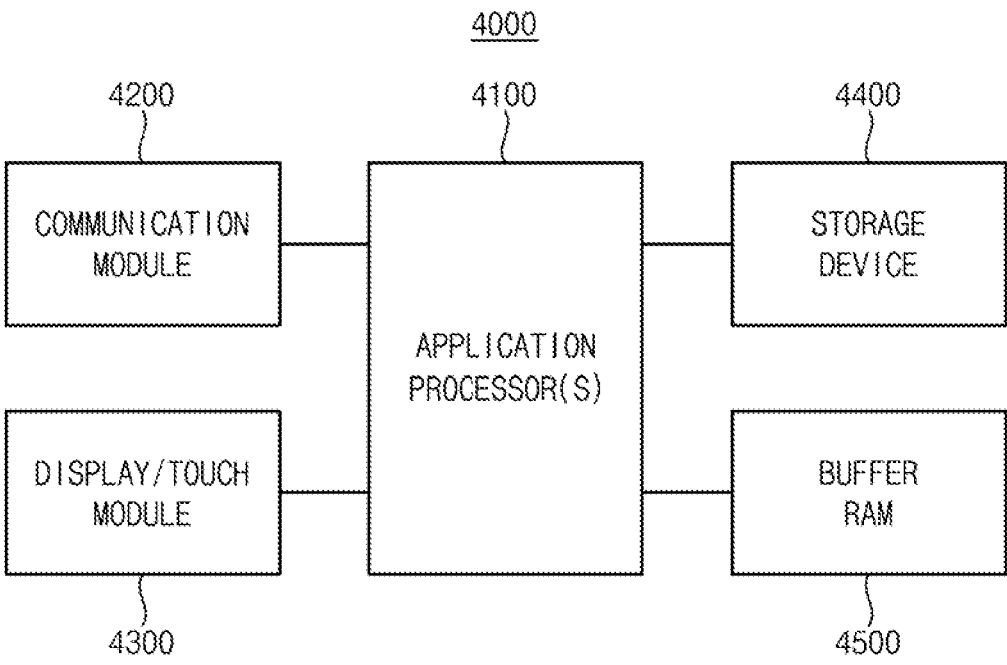
FIG. 9 is a schematic block diagram illustrating an electronic device including a semiconductor device in which at least one of the BEOL structures 300 and 400 shown in FIGS. 3 and 4 is used, according to an example embodiment.

FIG. 9 is a schematic block diagram illustrating an electronic device including a semiconductor device in which at least one of the BEOL structures 300 and 400 shown in FIGS. 3 and 4 is used, according to an example embodiment.

Referring to FIG. 9, an electronic device 4000 may include at least one application processor 4100, a communication module 4200, a display/touch module 4300, a storage device 4400, and a buffer random access memory (RAM) 4500. The electronic device 4000 may be a mobile device such as a smartphone or a tablet computer, not being limited thereto, according to embodiments.

The application processor 4100 may control operations of the electronic device 4000. The communication module 4200 may be implemented to perform wireless or wire communications with an external device. The display/touch module 4300 may be implemented to display data processed by the application processor 4100 and/or to receive data through a touch panel. The storage device 4400 may be implemented to store user data. The storage device 4400 may be an embedded multimedia card (eMMC), a solid state drive (SSD), a universal flash storage (UFS) device, etc., not being limited thereto. The storage device 4400 may perform caching of the mapping data and the user data as described above.

The buffer RAM 4500 may temporarily store data used for processing operations of the electronic device 4000. For example, the buffer RAM 4500 may be volatile memory such as double data rate (DDR) synchronous dynamic random access memory (SDRAM), low power double data rate (LPDDR) SDRAM, graphics double data rate (GDDR) SDRAM, Rambus dynamic random access memory (RDRAM), etc.

At least one component in the electronic device 4000 may include at least one of the BEOL structures 300 and 400 shown in FIGS. 3 and 4, according to embodiments.

The foregoing is illustrative of exemplary embodiments and is not to be construed as limiting the inventive concept. Although a few exemplary embodiments have been described, those skilled in the art will readily appreciate that many modifications are possible in the above embodiments without materially departing from the inventive concept.

What is claimed is:

1. A method of manufacturing a connection structure for an integrated circuit, the method comprising:

forming a $1^{st}$ layer comprising a $1^{st}$ metal line;

forming a $2^{nd}$ layer, above the $1^{st}$ layer, comprising an initial via structure vertically connected to the $1^{st}$ metal line;

removing an upper portion of the initial via structure from the $2^{nd}$ layer to form a hole exposing a top surface of a lower portion of the initial via structure;

forming a spacer layer along a side surface of the hole, wherein the spacer layer has a horizontal thickness that is uniform along the side surface of the hole;

filling the hole with a via material to be combined with the lower portion of the initial via structure to form a $1^{st}$ via comprising metal in the $2^{nd}$ layer; and forming a $3^{rd}$ layer comprising a $2^{nd}$ metal line above the $2^{nd}$ layer such that the $1^{st}$ via is vertically connected to the $2^{nd}$ metal line through metal-to-metal connection.

2. The method of claim 1, wherein the forming the $3^{rd}$ layer comprises:

forming a $3^{rd}$ metal line adjacent to the $2^{nd}$ metal line in the $3^{rd}$ layer;

isolating the $2^{nd}$ metal line from the $3^{rd}$ metal line through an interlayer dielectric (ILD) layer; and isolating the $1^{st}$ via from the $3^{rd}$ metal line through the spacer layer and the ILD layer.

3. The method of claim 2, further comprising:

forming a 4th layer, above the $3^{rd}$ layer, comprising a $2^{nd}$ via connected to the $3^{rd}$ metal line; and forming a 5th layer, above the 4th layer, comprising a 4th metal line connected to the $2^{nd}$ via.

4. The method of claim 1, wherein the $1^{st}$ via is directly connected to the $2^{nd}$ metal line.

5. The method of claim 2, wherein a horizontal distance between an upper-right or upper-left edge of the $1^{st}$ via contacting the spacer layer and the 3rd metal line is greater than a horizontal distance between the $2^{nd}$ metal line and the $3^{rd}$ metal line.

6. The method of claim 2, wherein a horizontal distance between an upper-right or upper-left edge of the spacer layer, not contacting the $1^{st}$ via, and the $3^{rd}$ metal line is smaller than a horizontal distance between the $2^{nd}$ metal line and the $3^{rd}$ metal line.

7. A method of manufacturing a connection structure for an integrated circuit, the method comprising:

forming a $1^{st}$ layer comprising a $1^{st}$ metal line;

forming a $2^{nd}$ layer, above the $1^{st}$ layer, comprising an initial via structure vertically connected to the $1^{st}$ metal line;

removing an upper portion of the initial via structure from the $2^{nd}$ layer to form a hole exposing a top surface of a lower portion of the initial via structure;

forming a spacer layer along a side surface of the hole, wherein the spacer layer has a horizontal thickness that is uniform along the side surface of the hole;

filling the hole with a via material to be combined with the lower portion of the initial via structure to form a $1^{st}$ via comprising metal in the $2^{nd}$ layer, wherein a $3^{rd}$ layer is formed to further comprise a $3^{rd}$ metal line such that the 3rd metal line is isolated from the $1^{st}$ via, and comprises a protrusion in a form of via, wherein the $3^{rd}$ metal line comprises a metal line and the protrusion as a top via, and wherein the metal line and the protrusion is a single continuous structure without a connection surface therebetween.

8. The method of claim 7, wherein the $3^{rd}$ metal line has a height greater than the $2^{nd}$ metal line by a height of the protrusion.

* * * * *